(12) United States Patent
Dries et al.

(10) Patent No.: US 6,555,890 B2
(45) Date of Patent: Apr. 29, 2003

(54) METHOD FOR COMBINED FABRICATION OF INDIUM GALLIUM ARSENIDE/INDIUM PHOSPHIDE AVALANCHE PHOTODIODES AND P-I-N PHOTODIODES

(75) Inventors: J. Christopher Dries, Skillman, NJ (US); Michael Lange, Yardley, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 09/863,836

(22) Filed: May 23, 2001

(65) Prior Publication Data

US 2002/0011642 A1 Jan. 31, 2002

Related U.S. Application Data

(60) Provisional application No. 60/206,346, filed on May 23, 2000.

(51) Int. Cl.$^7$ .................................................. H01L 31/075
(52) U.S. Cl. ........................ 257/458; 257/436; 257/437
(58) Field of Search ................................. 257/436, 437, 257/458; 357/30, 52, 58; 438/91, 93

(56) References Cited

U.S. PATENT DOCUMENTS

| | | | | |
|---|---|---|---|---|
| 4,366,377 A | | 12/1982 | Notthoff et al. | 250/211 |
| 4,616,247 A | * | 10/1986 | Chang et al. | 257/438 |
| 4,857,982 A | * | 8/1989 | Forrest | 257/186 |
| 5,125,050 A | * | 6/1992 | Deri | 385/11 |
| 5,148,251 A | | 9/1992 | Kim et al. | 357/30 |
| 5,397,889 A | * | 3/1995 | Minot et al. | 250/214.1 |
| 6,015,721 A | * | 1/2000 | Kim | 438/91 |

* cited by examiner

Primary Examiner—David Nelms
Assistant Examiner—Dao H. Nguyen
(74) Attorney, Agent, or Firm—Wolff & Samson, P.C.

(57) ABSTRACT

An Indium/Gallium/Arsenide (InGaAs) detector having avalanche photodiodes (APD's) and p-i-n photodiodes on a single chip is provided. A method of fabricating the InGaAs device is also provided. The bias on the APD and p-i-n photodiodes are separately controlled.

15 Claims, 10 Drawing Sheets

METHOD FOR COMBINED FABRICATION OF INDIUM GALLIUM ARSENIDE/INDIUM PHOSPHIDE AVALANCHE PHOTODIODES AND P-I-N PHOTODIODES

RELATED APPLICATIONS

This application claims the priority of Provisional Patent Application Ser. No. 60/206,346, filed May 23, 2000, the entire disclosure of which is expressly incorporated herein by reference.

BACKGROUND OF THE INVENTION

1. Field of the Invention

This invention relates to a method for combined fabrication of Indium Gallium Arsenide (InGaAs)/Indium Phosphide (InP) avalanche photodiodes (APD's) and p/intrinsic/n type conductivity (p-i-n) photodiodes for simultaneous receiving and tracking.

2. Related Art

InGaAs photodiodes have smaller bandgaps than silicon-based photodiodes and are therefore preferable for use in high speed optical data transmission, and high speed switching, applications. In devices that include free space optical communications, or any application that concurrently utilizes APD's (for receiving high data rate optical information) and p-i-n photodiodes (where low data rates and low noise amplifiers do not necessitate an APD), one must use separate detector chips for the two different devices.

An APD requires extraordinary control of the epitaxial structure and of the placement of the P-N junction compared to a low noise p-i-n. An APD requires very high electric fields in order to create gain or amplification. Therefore, an APD cannot be directly fabricated in low bandgap InGaAs alone because the field necessary for gain will cause premature breakdown in the device.

As free space optical telecommunication systems become more prevalent, there is a greater need for combined APD and pin photodiode detectors. This is particular true in systems that may be reconfigured dynamically where beam steering is important. For example, a quadrant p-i-n detector may be used to steer an optical head towards a laser transmitter, and at the same time, an avalanche photodiode may be used for high data rate reception. Another application is that of laser rangefinding, where an avalanche photodiode may be used for the ranging task, and a p-i-n photodiode may be used for a slower communications channel.

What would be desirable, but has not heretofore been developed, is a method for fabricating APD and p-i-n photodiodes on the same chip.

OBJECTS AND SUMMARY OF THE INVENTION

It is an object of the present invention to provide an InGaAs detector having APD and p-i-n photodiodes fabricated on a single chip.

It is an additional object of the present invention to provide a method for fabricating an InGaAs detector having APD and p-i-n photodiodes on a single chip.

It is an additional object of the present invention to provide an InGaAs detector having APD and p-i-n photodiodes wherein the bias for each of the photodiodes can be independently controlled.

The present invention relates to an InGaAs detector with APD's and p-i-n photodiodes on a single chip. The APD's and the p-i-n photodiodes are fabricated using three separate diffusions for the formation of the p-n junction. First, the entire wafer is patterned using SiNx, and holes opened in the SiNx wherever the p-i-n diodes are to be fabricated. A deep diffusion through the APD gain layer, field control layer, speed-up layers and into the InGaAs absorption layer forms the p-i-n photodiode. A second SiNx diffusion barrier layer is deposited, and the avalanche photodiode pattern is etched in it. This APD is formed by two additional diffusions, but the diffusion depth is such that the p-n junction is formed in the undoped InP gain region. Contacts are made to the anodes and cathodes of the p-i-n and APD separately, in order to offer independent bias control for the two types of photodiodes to the user. In this manner an InGaAs device having any desired combination of APD's and p-i-n photodiodes can be constructed.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

The present invention relates to a detector containing Indium/Galium/Arsenide (InGaAs) avalanche photodiodes (APD's) and p/intrinsic/n type conductivity (p-i-n) photodiodes on the same epitaxial wafer with separate connections for biasing each device. This invention also relates to a method for fabricating such a device.

An APD cannot be fabricated in low bandgap InGaAs alone because the field necessary for gain will cause premature breakdown in the device. A separate high bandgap InP layer must therefore be added to the structure to sustain the necessary electric field. This "field control" layer changes the performance of the p-i-n photodiode however. So additional fabrication steps must be added to independently optimize the p-i-n photodiode. For one thing, the junction of the p-i-n photodiode must traverse the entire "field control" layer and reside in the InGaAs in order for the component to be photovoltaic (respond to light without reverse voltage). Low noise detection by the p-i-n photodiode depends on being able to run the detectors at 0 volts. However, the APD requires from 40 to 60 volts reverse bias to optimize gain and performance. Therefore, not only does the junction formation have to be different, but the p-i-n photodiode and APD must also have their cathodes separated as well in order to be able to independently bias the two components. This requires having the epitaxial structures grown on semi-insulating (Fe:InP) rather than the traditional N-type InP and a fabrication process than isolates the two components.

Figure 1:
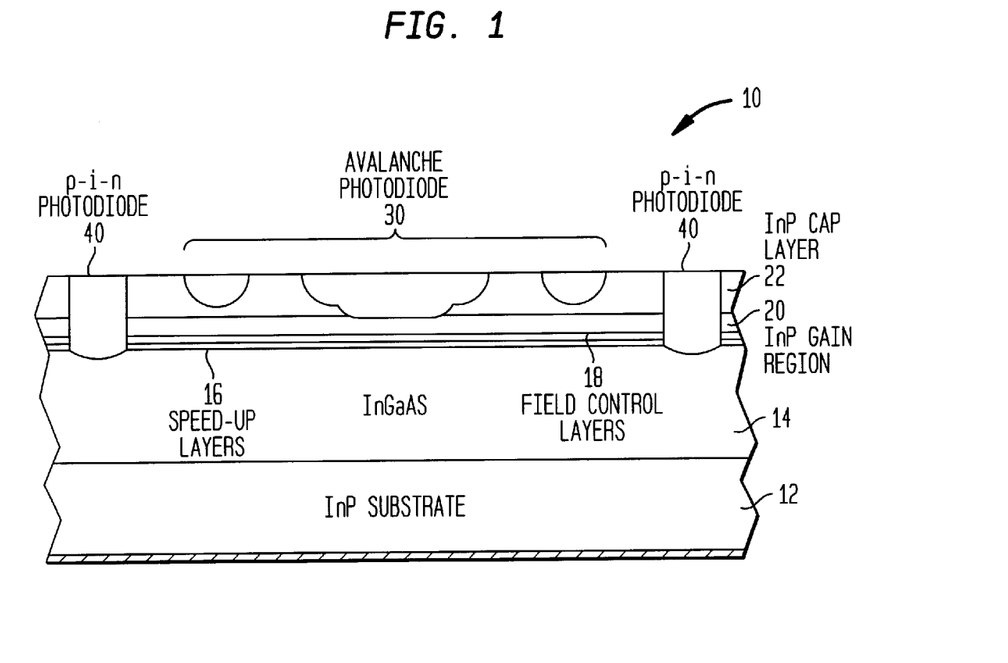
FIG. 1 is a sectional view through an InGaAs detector according to the invention having an APD and p-i-n photodetectors on a single chip.

A representative wafer structure according to the present invention is depicted in FIG. 1. The wafer, generally indicated at 10, is built on an InP substrate 12 and incorporates an InGaAs layer 14 for absorption of light in the range of 0.9 to 1.7 μm wavelengths, as well as an InP gain region 20. Several other layers are used for both electric field control 18 and hole speed-up 16. An InP cap layer 22 caps the device 10. APD 30 and p-i-n photodiodes 40 are provided on the device 10.

The APD's and the p-i-n photodiodes are fabricated using three separate diffusions for the formation of the p-n junction. First, the entire wafer is patterned using SiNx, and holes opened in the SiNx wherever the p-i-n diodes are to be fabricated. A deep diffusion through the APD gain layer, field control layer, speed-up layer and into the InGaAs absorption layer forms the p-i-n photodiode. A second SiNx diffusion barrier layer is deposited, and the avalanche photodiode pattern is etched in it. While any type of planar APD architecture may be used, a floating guard ring structure is preferred. This APD is formed by two additional diffusions, but the diffusion depth is such that the p-n junction is formed in the undoped InP gain region. Contacts are made to the anodes and cathodes of the p-i-n and APD separately in order to offer independent bias control for the two devices. Basically, the fact that one device structure can be patterned with SiNx allows for accurate positioning of the p-n junction in any layer of the device. If diffusion is stopped in the InP layer an APD is formed, but if the diffusion is brought down to the InGaAs layer a p-i-n photodiode is formed. Diffusion is controlled by temperature and time. Independent bias control allows for the optimization of the performance or each device.

The avalanche photodiode of this invention has a plurality of functional regions each layered one on another over a substrate. The uppermost layer is a multiplication region and is made from a first semiconductive material doped with an impurity of a first conductivity type. A central region is doped with an impurity of a second conductivity type. The central region is then surrounded by at least one guard ring of the same material and conductivity type as the central region. The guard ring does not contact any source of electric current. In this manner the photodiode has an avalanche effect that is substantially confined to the central region. Any breakdown occurring at the edge or periphery of the avalanche photodiode is substantially reduced.

Figure 2:
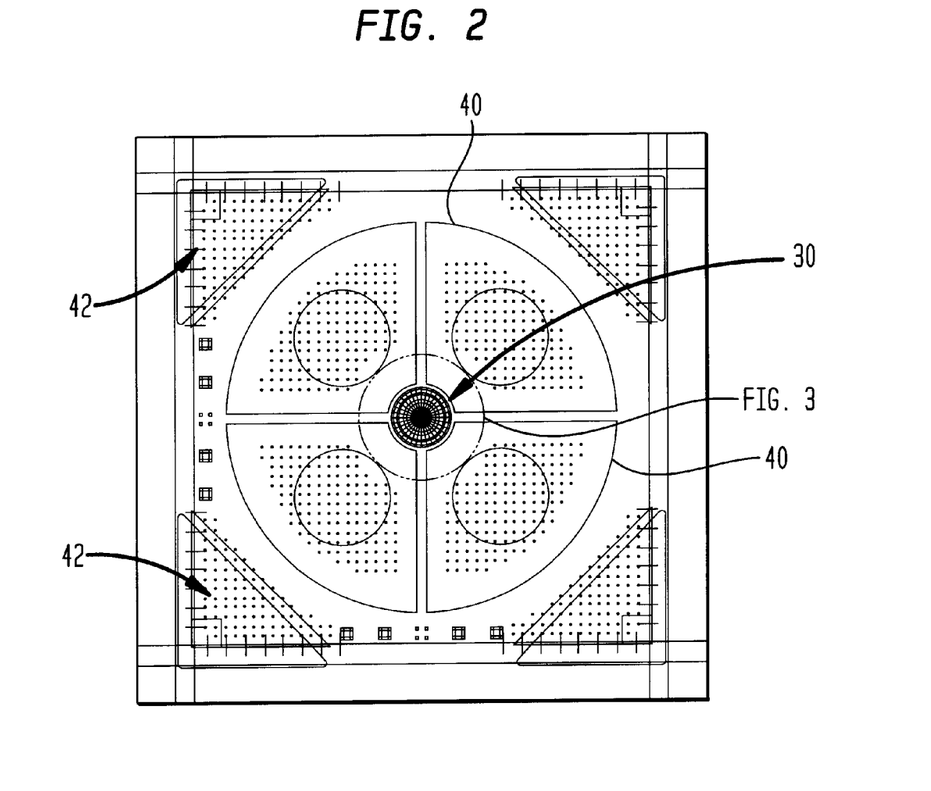
FIG. 2 is a schematic top view of the device shown in FIG. 1 showing an APD and p-i-n photodiodes on a single chip.

FIG. 2 is a schematic top view of the device shown in FIG. 1 showing an APD 30 and p-i-n photodiodes 40 on a single chip. This device is useful for tracking and receiving optical information transmitted in the eye-safe near intra-red spectrum. The APD 30 functions as a high speed receiver for 0.9 μm to 1.7 μm wavelength eye-safe optical communication. It is independently bias controlled near 50 v for optimum sensitivity. A similar APD was disclosed in U.S. Pat. No. 4,857,982 to *Forrest*, the entire disclosure of which is expressly incorporated herein by reference. The p-i-n photodiodes 40 positioned about the periphery of the APD 30 are low noise detectors that serve as tracking devices of the signal for the APD 30. The p-i-n photodetectors 40 operate near zero bias voltage to optimize sensitivity. Cathodes 42 are included on the device.

Figure 3:
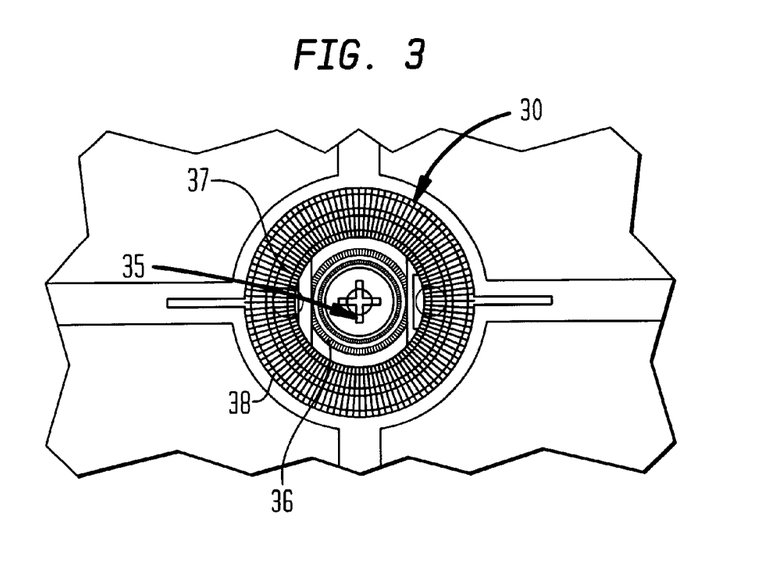
FIG. 3 is an enlarged schematic of the APD shown in FIG. 2.

FIG. 3 is an enlarged schematic view of the APD 30 shown in FIG. 2. The APD 30 includes a central junction 35, guard rings 36, independent cathode 37 and isolation etch 38.

Figure 4:
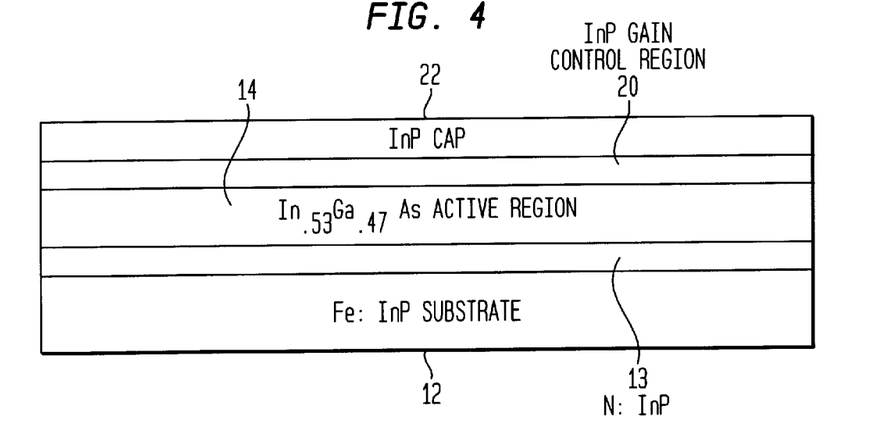
FIGS. 4–25 show the steps for fabricating an InGaAs detector according to the present invention.
Figure 5:
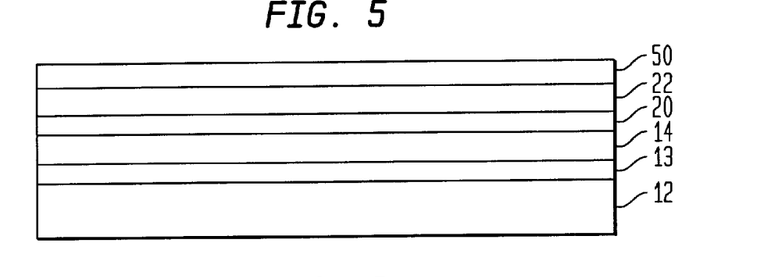
Figure 6:
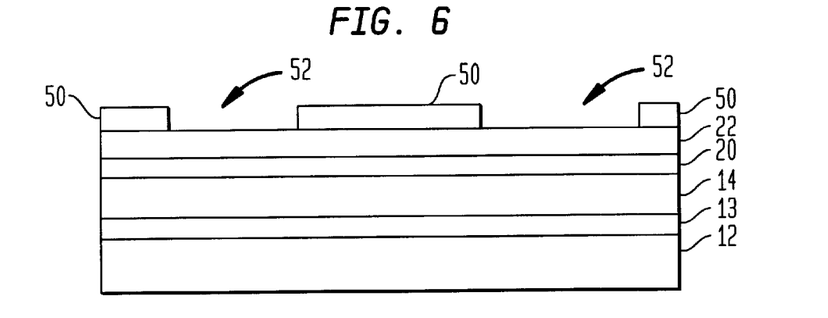
Figure 7:
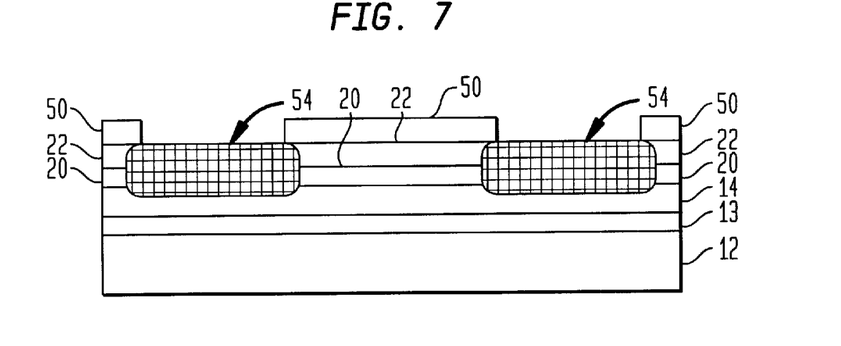
Figure 8:
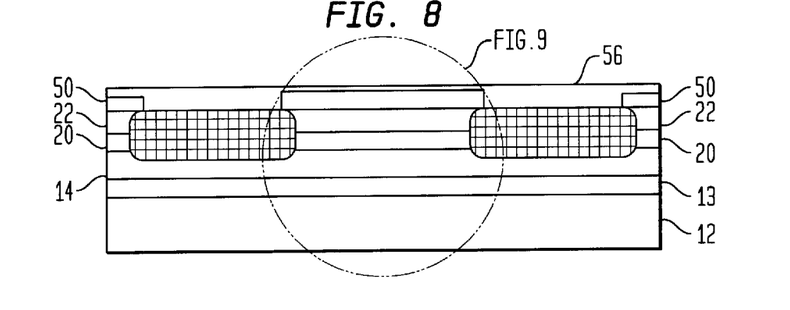
Figure 9:
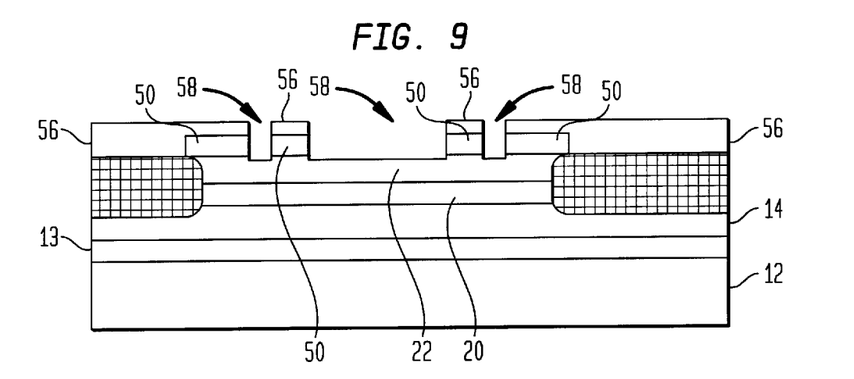
Figure 10:
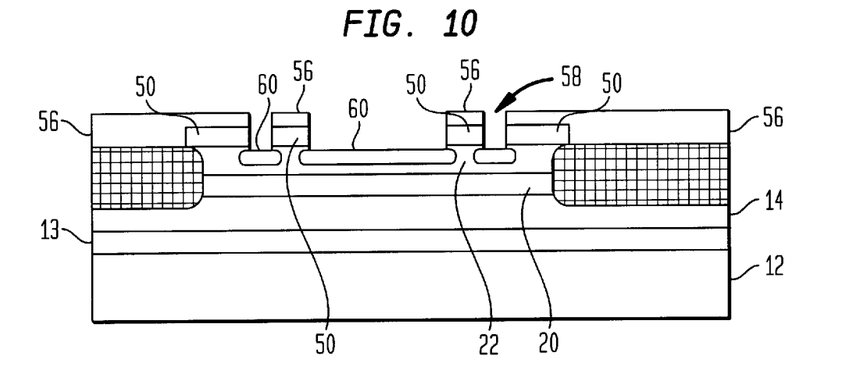
Figure 11:
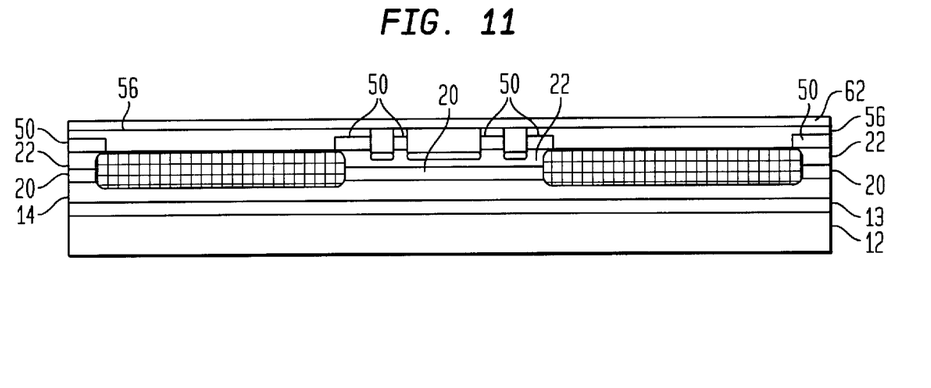
Figure 12:
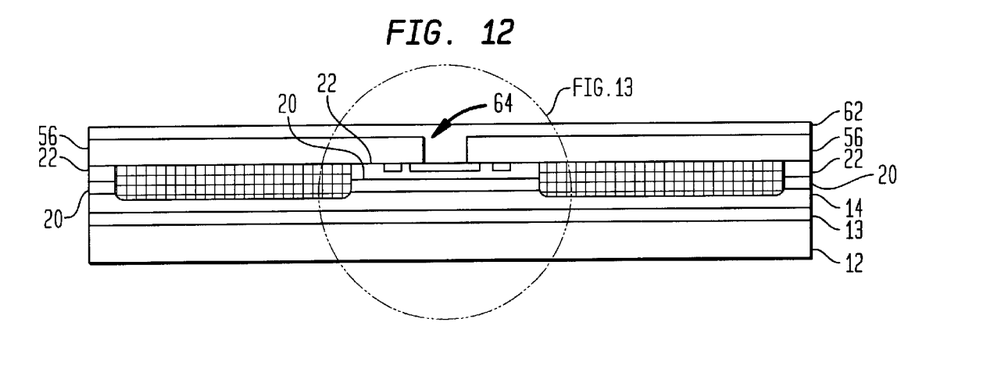
Figure 13:
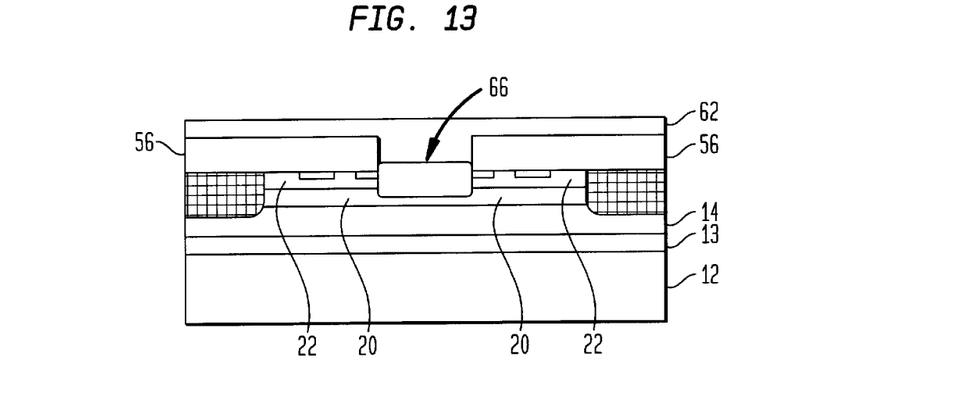
Figure 14:
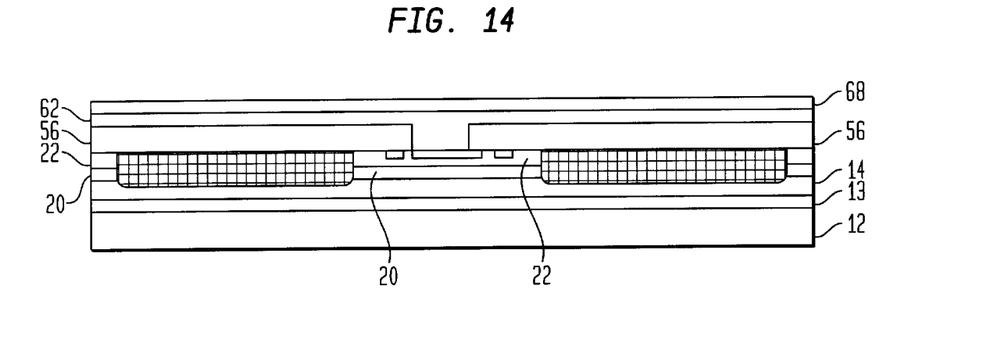
Figure 15:
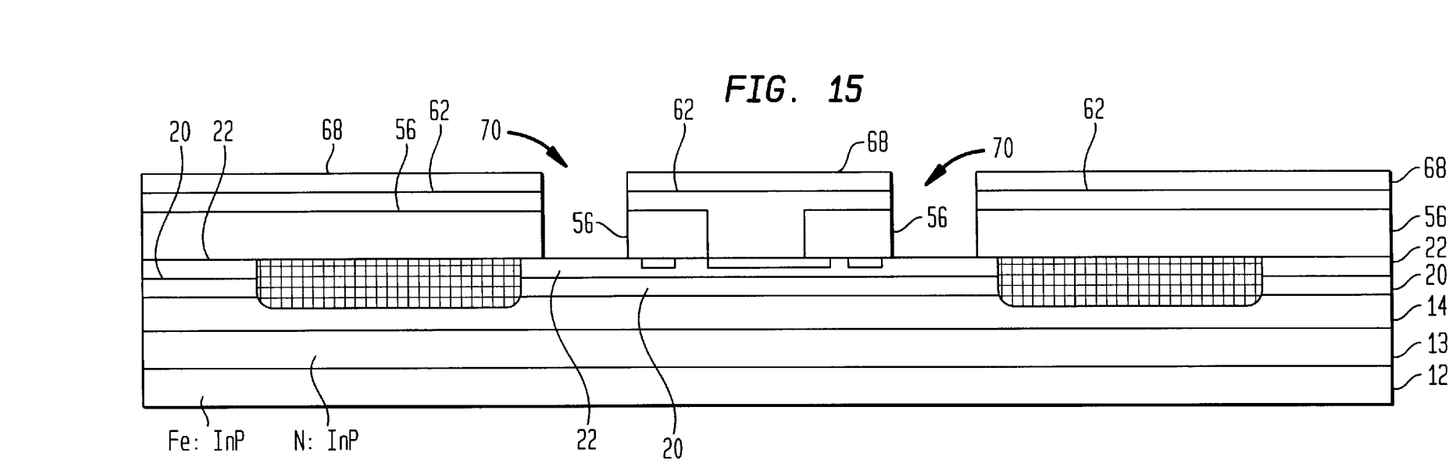
Figure 16:
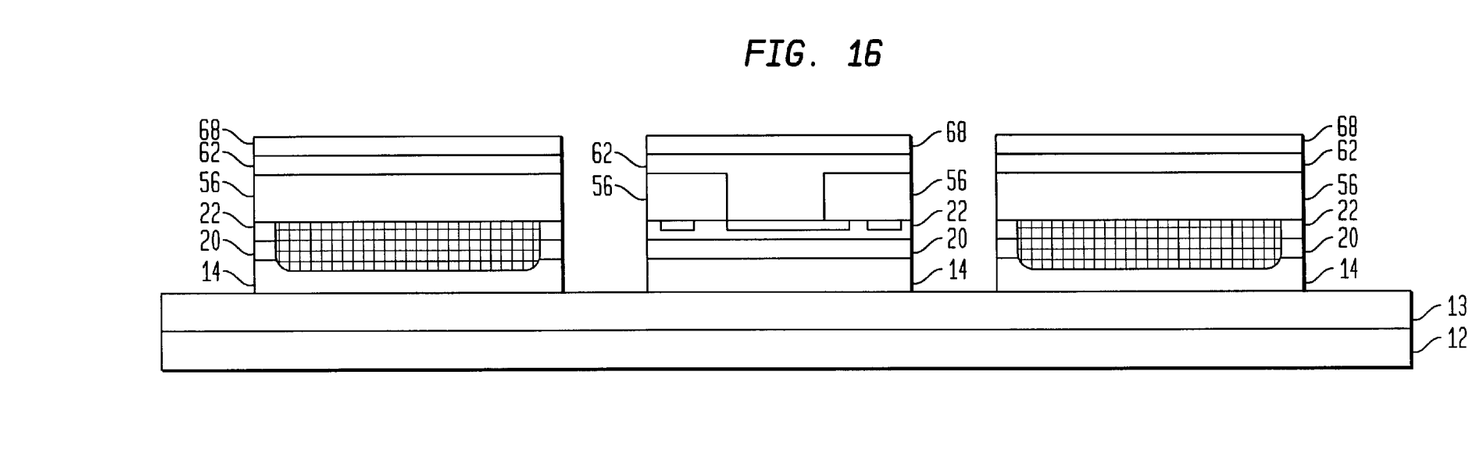
Figure 17:
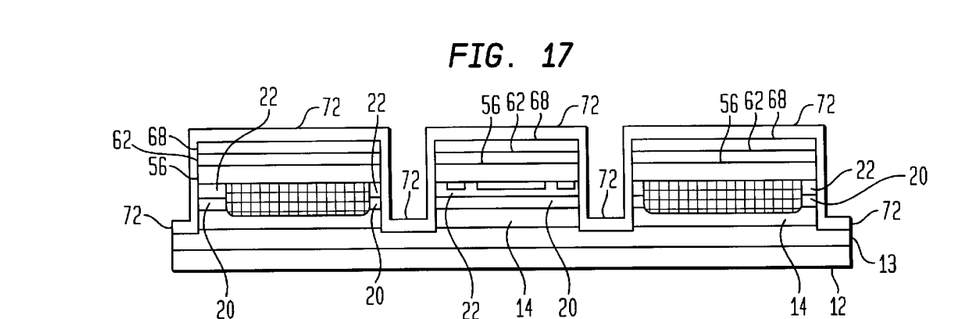
Figure 18:
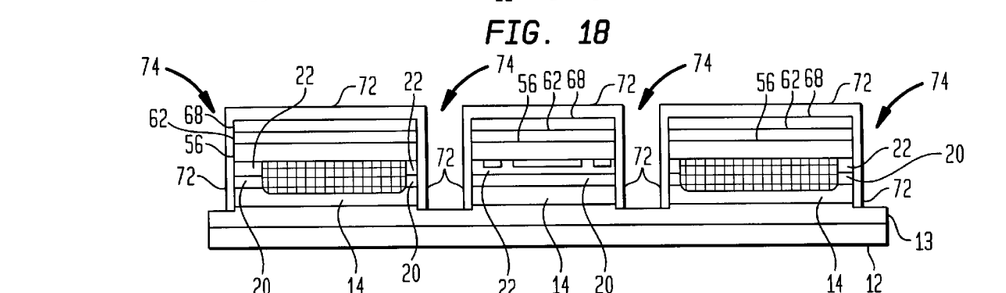
Figure 19:
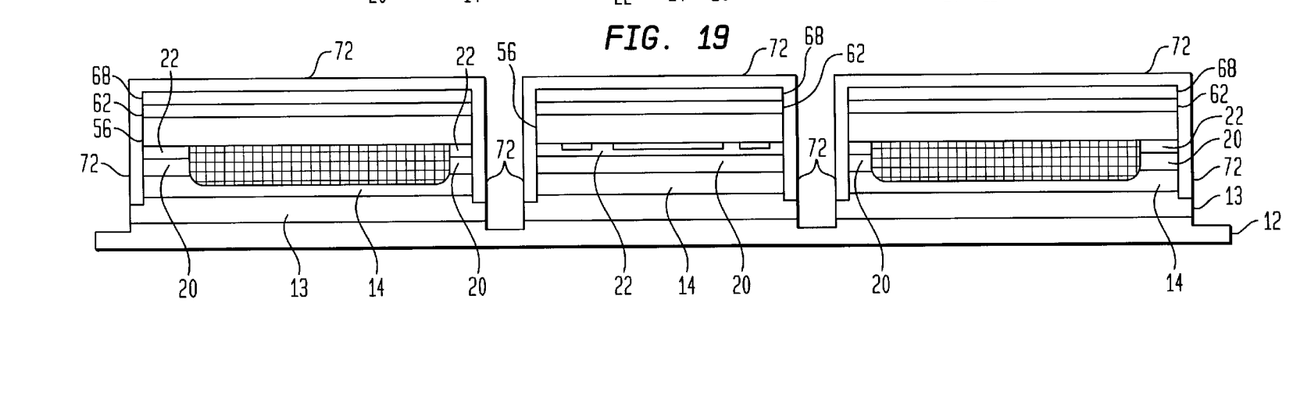
Figure 20:
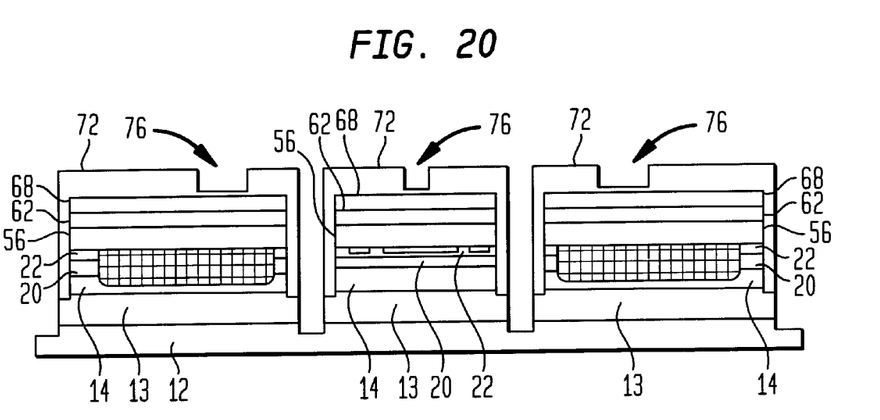
Figure 21:
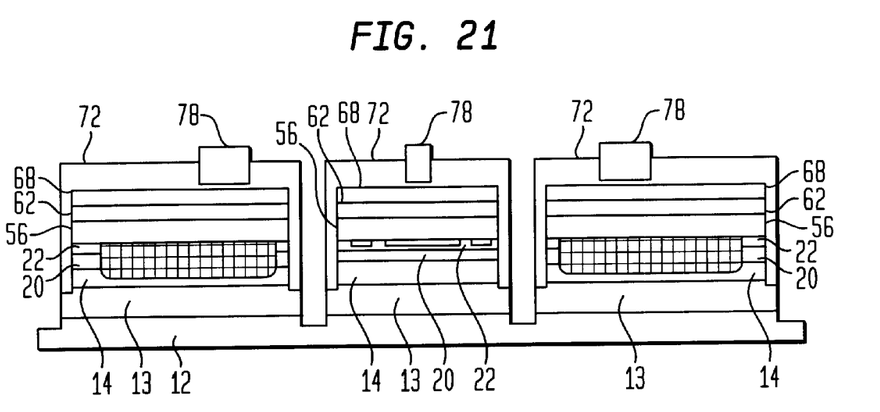
Figure 22:
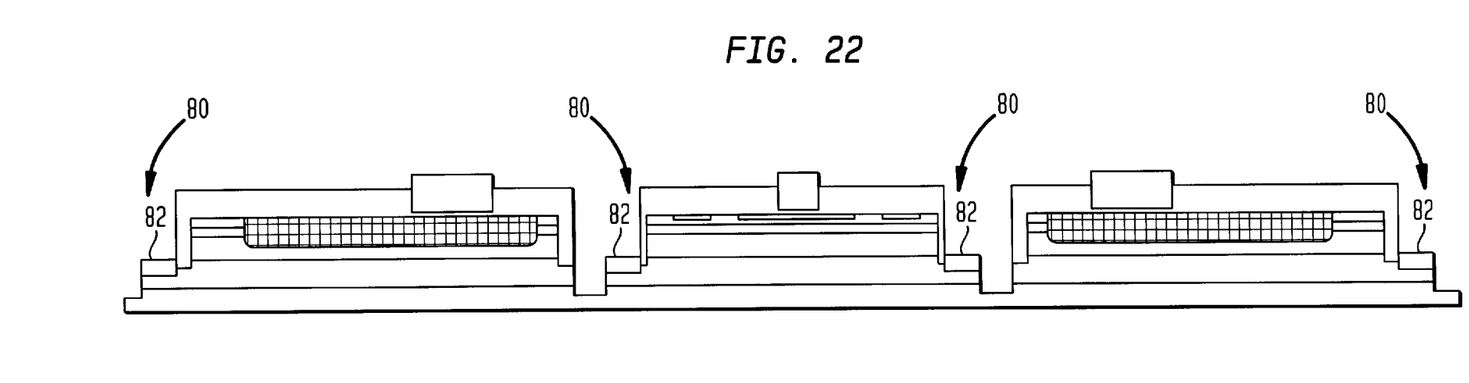
Figure 23:
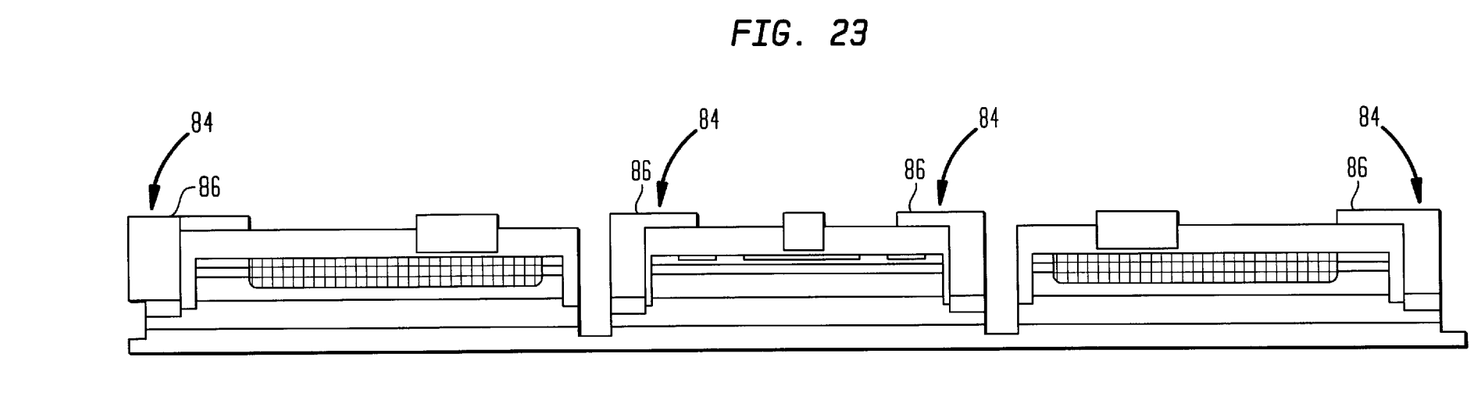

The starting point for the device of the present invention is an epitaxial structure, shown in FIG. 4, having an Fe:InP substrate 12, N:InP layer 13, InGaAs active region 14, such as $In_{0.53}Ga_{0.47}As$, an InP gain control region 20 and an InP cap. The process for fabricating the combined device of the present invention, in more detail than previously set forth herein comprises:

1. As shown in FIG. 5, the first step is to the passivate wafer surface with 100 nm layer of silicon nitride (SiNx) 50.
2. As shown in FIG. 6, the next step is Photolithography #1: Pattern p-i-n detector area and etch SiNx to open p-i-n detector holes 52.
3. As shown in FIG. 7, the next step is to perform sealed ampoule process to diffuse zinc through electric field control layer and 0.5 μm into InGaAs absorption layer to form p-i-n detection junction 54.
4. As shown in FIG. 8, the next step is a deposit of 75 nm layer of SiNx 56.
5. FIG. 9 shows Photolithography #2: Pattern guard ring section of APD and etch SiNx to open APD guard ring holes 58.
6. FIG. 10 shows the step of diffusing zinc by same technique as step no. 3 to a depth slightly above the top of the InP electric field control layer to form APD guard ring junction 60.
7. FIG. 11 shows the deposit of another 75 nm layer of SiNx 62.
8. FIG. 12 shows Photolithography #3: Pattern central region of APD and etch SiNx to open hole 64 for APD diffusion.
9. FIG. 13 shows diffusion of zinc 66 to a depth such that the APD displays optimum performance without exhibiting premature edge breakdown.
10. FIG. 14 shows the deposit of another 75 nm layer of SiNx 68.
11. FIG. 15 shows Photolithography #4: Pattern region where N-contact cathode connections will later be formed and etch SiNx to open N-channel holes 70.
12. FIG. 16 shows the use of methane/hydrogen plasma to anisotropically etch the InP layers from the N-channel region. Then selective citric acid/peroxide etching is used through InGaAs layer down to N-type InP buffer layer.
13. FIG. 17 shows the deposit of 100 nm of SiNx 72.
14. FIG. 18 shows Photolithography #5: Pattern area that will isolate the APD from the tracking p-i-n detectors and etch SiNx to open isolation holes 74.
15. FIG. 19 shows the use of methane/hydrogen plasma and hydrobromic acid to etch isolation ring down into the semi-insulating InP substrate.
16. FIG. 20 shows Photolithography #6: Pattern area where p-contacts are to be formed and etch SiNx to open holes 76 for P-contacts.
17. FIG. 21 shows a deposit of gold/zinc p-contact metal 78, lift-off and anneal to alloy.
18. FIG. 22 shows Photolithography #7: Pattern area where n-contacts are to be formed and etch SiNx to open holes 80.
19. Also shown in FIG. 22 is a deposit of germanium/nickel/gold n-contact metal 82, lift-off and anneal to alloy.
20. FIG. 23 shows Photolithography #8: Pattern area to open holes 84 where interconnection metal is to be placed.
21. FIG. 23 also shows the deposit of titanium/gold interconnection metals 86 and lift-off excess.

Figure 24:
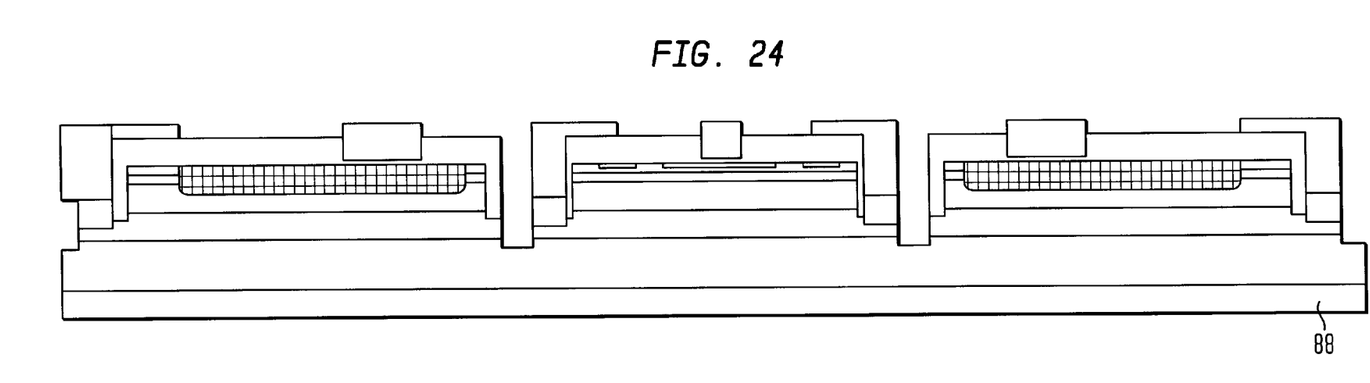
Figure 25:
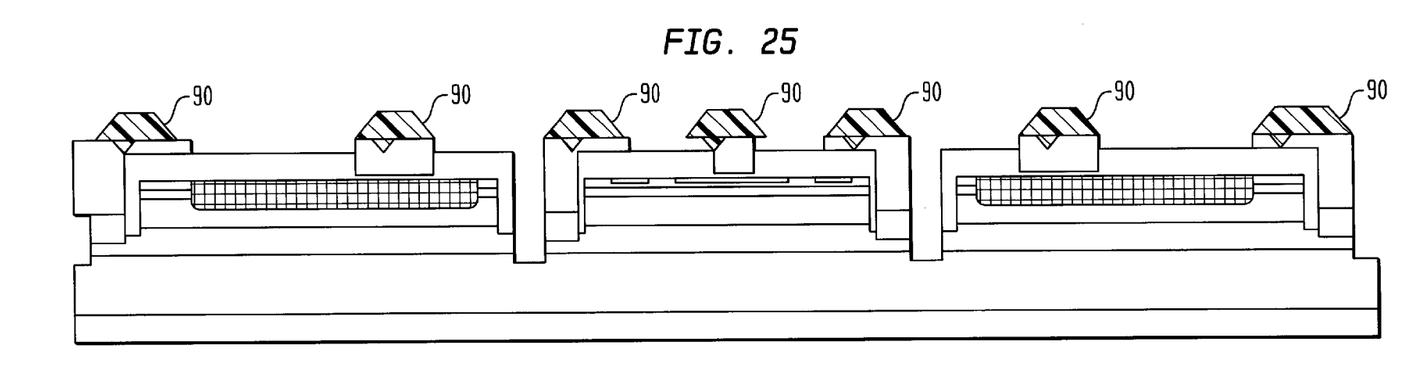

22. FIG. 24 shows the lap of the back of the wafer down to a final thickness of 0.005-0.006 and polish to mirror-like finish.
23. FIG. 24 also shows a deposit of SiNx anti-reflective coating 88 for desired wavelength on back polished surface.
24. FIG. 25 shows Photolithography #9: Pattern the areas on the device to open holes where indium metal bumps are to be placed.
25. FIG. 25 also shows a deposit of thick chrome/indium bump metal 90 and lift-off excess metal.
26. Diamond scribe the wafer into individual die.
27. Flip-chip, bump-bond the chips to an appropriate package sub-mount.

The unique and important steps for fabricating the device are junction formation of the APD and p-i-n which are performed in step numbers 2, 3, 5, 6, 8 and 9, and the cathode isolation steps set forth in step numbers 11, 12, 14 and 15.

Having thus described the invention in detail, it is to be understood that the foregoing description is not intended to limit the spirit and scope thereof. What is desired to be protected by Letters Patent is set forth in the appended claims.

What is claimed is:

1. An integrated dual sensitivity photodetector disposed in a single Indium Gallium Arsenide semiconductor substrate comprising:
    a region having a relatively high sensitivity photodetector; and
    a lower sensitivity region having a relatively lower sensitivity photodetector;
    wherein said dual sensitivity photodetector is capable of both providing an aiming signal to an optical aiming circuit and receiving a modulated optical high speed data signal.

2. The photodetector of claim 1 wherein the photodetectors are Indium Gallium Arsenide photodiodes.

3. The photodetector of claim 1 wherein the high sensitivity region is centrally located and the lower sensitivity region is substantially arrayed about the high sensitivity region.

4. The photodetector of claim 3 wherein the photodetector is capable of receiving a modulated optical signal with a wavelength in the range of 0.9 to 1.7 $\mu$m.

5. The photodetector of claim 2 wherein the relatively high sensitivity photodetector region comprises an avalanche photodetector.

6. The photodetector of claim 5 wherein the relatively lower sensitivity photodetector region comprises a p/intrinsic/n type photodiode (p-i-n).

7. A photodetector circuit comprising:
    an integrated dual sensitivity photodetector disposed in a planar semiconductor material comprising a central region comprising a relatively high sensitivity photodiode device;
    a surrounding region comprising a relatively lower sensitivity photodiode wherein the central region and the surrounding region are substantially symmetrically arrayed about a central point and the two regions are radially separated into matched segments; and
    individual bias voltage means wherein a bias voltage is applied across each device separately such that the signal performance of each photodiode device is optimized.

8. An InGaAs optical communication receiver integrated on a single chip comprising:
    an InGaAs avalanche photodiode formed on the chip;
    a plurality of InGaAs p-i-n photodiodes formed on the chip and positioned about the InGaAs avalanche photodiode; and
    separate bias means for the InGaAs avalanche photodiode and the InGaAs p-i-n photodiodes for separately biasing the photodiodes.

9. An InGaAs photodetector comprising:
    an avalanche photodiode formed on a substrate; and
    at least one p-i-n photodiode formed on the substrate,
    wherein the avalanche photodiode and the at least one p-i-n photodiode can be independently biased.

10. The photodetector of claim 9, further comprising a plurality of p-i-n photodiodes formed on the substrate.

11. The photodetector of claim 10, wherein the plurality of p-i-n photodiodes are positioned about the periphery of the avalanche photodiode.

12. The photodetector of claim 9, wherein the at least one p-i-n photodiode tracks a signal emitted by the avalanche photodiode.

13. The photodetector of claim 9, wherein the avalanche photodiode comprises a high-speed photodiode.

14. The photodetector of claim 9, wherein the avalanche photodiode operates at wavelengths of between 0.9 $\mu$m and 1.7 $\mu$m.

15. The photodetector of claim 9, wherein the at least one p-i-n photodiode operates with a zero bias voltage.

* * * * *